United States Patent
Spiess et al.

(10) Patent No.: US 6,750,770 B2
(45) Date of Patent: Jun. 15, 2004

(54) TRANSPONDER WITH A CHANGEABLE CIRCUIT CONFIGURATION

(75) Inventors: Bernhard Spiess, Graz (AT); Werner Janesch, Voitsberg (AT); Pamir Erdeniz, Graz (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 74 days.

(21) Appl. No.: 10/262,386

(22) Filed: Oct. 1, 2002

(65) Prior Publication Data

US 2003/0067382 A1 Apr. 10, 2003

(30) Foreign Application Priority Data

Oct. 4, 2001 (EP) .............................. 01890284

(51) Int. Cl.[7] .............................. G08B 13/14
(52) U.S. Cl. ................. 340/572.3; 340/7.32; 340/10.1; 340/825.68; 340/825.69
(58) Field of Search .................. 340/572.3, 572.2, 340/572.6, 572.1, 572.4, 572.5, 500, 540, 551, 825.68, 825.69, 5.62, 5.63, 5.65, 5.66, 7.32–7.37, 7.38, 10.1

(56) References Cited

U.S. PATENT DOCUMENTS 6,091,342 A  *  7/2000  Janesch et al. ........ 340/825.54
6,097,278 A  *  8/2000  Arnold et al. ............ 340/10.1

* cited by examiner

*Primary Examiner*—Jeffery Hofsass
*Assistant Examiner*—Daniel Previl
(74) *Attorney, Agent, or Firm*—Kevin Simons

(57) ABSTRACT

A transponder (1) and an integrated circuit (4) have at least one signal channel (5, 6, 7), each signal channel (5, 6, 7) having at least two signal processing stages (25, 26, 27, 28, 29, 30, 31) and at least one signal processing stage (26, 27, 29) configured such as to be activatable and deactivatable, while an associated bypass branch (32, 33, 34), which is also activatable and deactivatable, is provided for each activatable and deactivatable signal processing stage (26, 27, 29), and a microcomputer (36) and a control register (37) controllable by the microcomputer, (36) are provided, by means of which each activatable and deactivatable signal processing stage (26, 27, 29) and the associated bypass branch (32, 33, 34) are activatable and deactivatable in counterphase.

8 Claims, 2 Drawing Sheets

TRANSPONDER WITH A CHANGEABLE CIRCUIT CONFIGURATION

The invention relates to a transponder which has at least one signal channel, which signal channel has transmission means and at least two signal processing stages connected to the output side of said transmission means.

The invention further relates to an integrated circuit for a transponder, which integrated circuit has at least one signal channel, which signal channel has transmission means and at least two signal processing stages connected to the output side of the transmission means.

A transponder as described above and an integrated circuit as described above have been developed and marketed in various embodiments by the Applicant and are therefore known. In the known embodiments, the transponder or the integrated circuit of the transponder has a fixed circuit configuration, so that the signal processing stages provided must be permanently supplied with power in their totality by power supply means of the transponder, i.e. by means of a non-rechargeable battery, with the consequence that all signal processing stages are permanently supplied with power in all possible operating conditions with the known embodiments, which in some operating conditions results in unnecessarily high energy consumption. This is particularly disadvantageous if the power supply of the transponder or of its integrated circuit is effected by means of a non-rechargeable battery, because the service life of the non-rechargeable battery is detrimentally influenced, i.e. shortened, by unnecessarily high energy consumption.

It is an object of the invention to eliminate the above difficulties and to realize an improved transponder and an improved integrated circuit.

To achieve the above-mentioned object, inventive features are provided in a transponder according to the invention such that a transponder according to the invention can be characterized in the following manner:

A transponder having at least one signal channel, which signal channel having transmission means and at least two signal processing stages connected to the output side of the transmission means, wherein at least one signal processing stage is configured so as to be activatable and deactivatable, and wherein for each activatable and deactivatable signal processing stage an associated bypass branch being provided for bypassing the associated signal processing stage, which bypass branch is also configured so as to be activatable and deactivatable, and wherein control means are provided by which the at least one activatable and deactivatable signal processing stage and the at least one associated activatable and deactivatable bypass branch are activatable and deactivatable, and wherein the control means and the at least one activatable and deactivatable signal processing stage and the at least one associated activatable and deactivatable bypass branch are configured such that upon deactivation of an activatable and deactivatable signal processing stage activation of the bypass branch associated with this signal processing stage occurs at the same time, and that upon activation of a signal processing stage deactivation of the bypass branch associated with this signal processing stage occurs at the same time.

To achieve the above-mentioned object, inventive features are provided in an integrated circuit according to the invention such that an integrated circuit according to the invention can be characterized in the following manner:

An integrated circuit for a transponder, which integrated circuit having at least one signal channel, which signal channel having transmission means and at least two signal processing stages connected to the output side of the transmission means, wherein at least one signal processing stage is configured so as to be activatable and deactivatable and wherein for each activatable and deactivatable signal processing stage for bypassing the associated signal processing stage, which bypass branch is also configured so as to be activatable and deactivatable, and wherein control means are provided by which the at least one activatable and deactivatable signal processing stage and the at least one associated activatable and deactivatable bypass branch are activatable and deactivatable, and wherein the control means and the at least one activatable and deactivatable signal processing stage and the at least one associated activatable and deactivatable bypass branch are configured such that upon deactivation of an activatable and deactivatable signal processing stage activation of the bypass branch associated with this signal processing stage occurs at the same time, and that upon activation of a signal processing stage deactivation of the bypass branch associated with this signal processing stage occurs at the same time.

The provision of the features according to the invention create the possibility in a relatively simple manner, in particular with the use of integrated technology and without substantial additional cost, that of all the activatable and deactivatable signal processing stages only those signal processing stages are activated and therefore made into energy consumers which are required for the presently obtaining operating condition from among all operating conditions realizable with the transponder according to the invention and with the integrated circuit according to the invention,. It is achieved thereby that signal processing stages not required for an operating condition remain or become deactivated, so that the deactivated signal processing stages consume no energy, whereby reduced energy consumption is or can be ensured, which is advantageous with regard to the lowest possible energy requirement. The desire to make do with the lowest possible energy requirement is present both in the case of so-called passive transponders, in which energy is supplied by means of a signal transmitted in a contactless manner to the transponder and rectified by means of rectification means, and in the case of so-called active transponders, in which energy is supplied from a non-rechargeable battery.

The activation and deactivation of signal processing stages and bypass branches of a transponder according to the invention or of an integrated circuit according to the invention can be realized, for example, during manufacture of the integrated circuit or the transponder, such that, subject to the executed activation and deactivation of the signal processing stages and bypass branches, a fixed circuit configuration is provided after manufacture. However, it has also proved advantageous if the activation and deactivation of signal processing stages and bypass branches can carried out in a programmable manner, it being possible to carry out such programmable activation and deactivation, for example, in that a communication station provided to communicate with the transponder according to the invention sends a command to this transponder, which command is evaluated in the transponder, and in consequence an activation or deactivation of signal processing stages and of bypass branches is effected, and therefore a change of the signal configuration.

In a transponder according to the invention or an integrated circuit according to the invention, the signal processing stages can be formed by filter stages or by decoding stages or by signal-generating stages. However, the measures according to the invention have proved particularly advantageous if at least some of the activatable and deactivatable signal processing stages are formed by amplifier stages. In this connection it may be mentioned that it is advantageous, for example, in a transponder with a large-area transmission coil in the transmission means, and therefore a high reception sensitivity, to deactivate one on more amplifier stages, since in this case it is possible to make do with a small number of amplifier stages, i.e. with at least one amplifier stage, it thereby being possible to make do with a low energy consumption because of the small number of amplifier stages to be supplied with energy. It may also be mentioned in this connection that in a transponder according to the invention, in which a small working distance is sufficient so that the transponder is always operated at only a short distance from a communication station and consequently, because of the short distance, receives a relatively high input signal, it is advantageous to deactivate one or more amplifier stages in order to keep the energy consumption in the transponder as small as possible. In this connection it should also be mentioned that at least one amplifier stage may also be deactivated as a function of the amplitude of a signal received with a transponder according to the invention because, for example in the case of a received signal of high amplitude, at least one amplifier stage can be deactivated, since multiple amplification is unnecessary in case of a received signal which in any case has high amplitude.

It has proved particularly advantageous if the features as claimed in claims 3 and 4 and as claimed in claims 7 and 8 are provided in a transponder according to the invention and in an integrated circuit according to the invention. These configurations have proved particularly advantageous with regard to achieving the highest possible diversity in the possible ways of influencing the activation and deactivation of signal processing stages and of bypass branches. The provision of timing means in a transponder according to the invention or an integrated circuit according to the invention offers the advantage, among others, that such additional timing means render it possible in a simple manner to detect the fact that, for a preset time period, for example a period of several days, no use of the transponder or of the integrated circuit has occurred, and that the transponder or the integrated circuit may then be controlled by deactivating all signal processing stages, so as to enter practically a standby state in which only very low energy consumption takes place. A transponder according to the invention or an integrated circuit according to the invention may be switched from such a wait state, for example, by actuating a separate wake-up key provided for this purpose. If the transponder according to the invention is essentially a so-called active transponder, the waking-up of such an active transponder from its standby state may be effected, for example, in that this active transponder is combined with a so-called passive transponder and a wake-up signal is fed in a contactless manner to the passive transponder so as to wake up the active transponder.

The above-mentioned aspects and further aspects of the invention will become apparent from the embodiment described below and are explained with reference to this embodiment.

The invention will be further described with reference to embodiments shown in the drawings to which, however, the invention is not limited.

Figure 1:
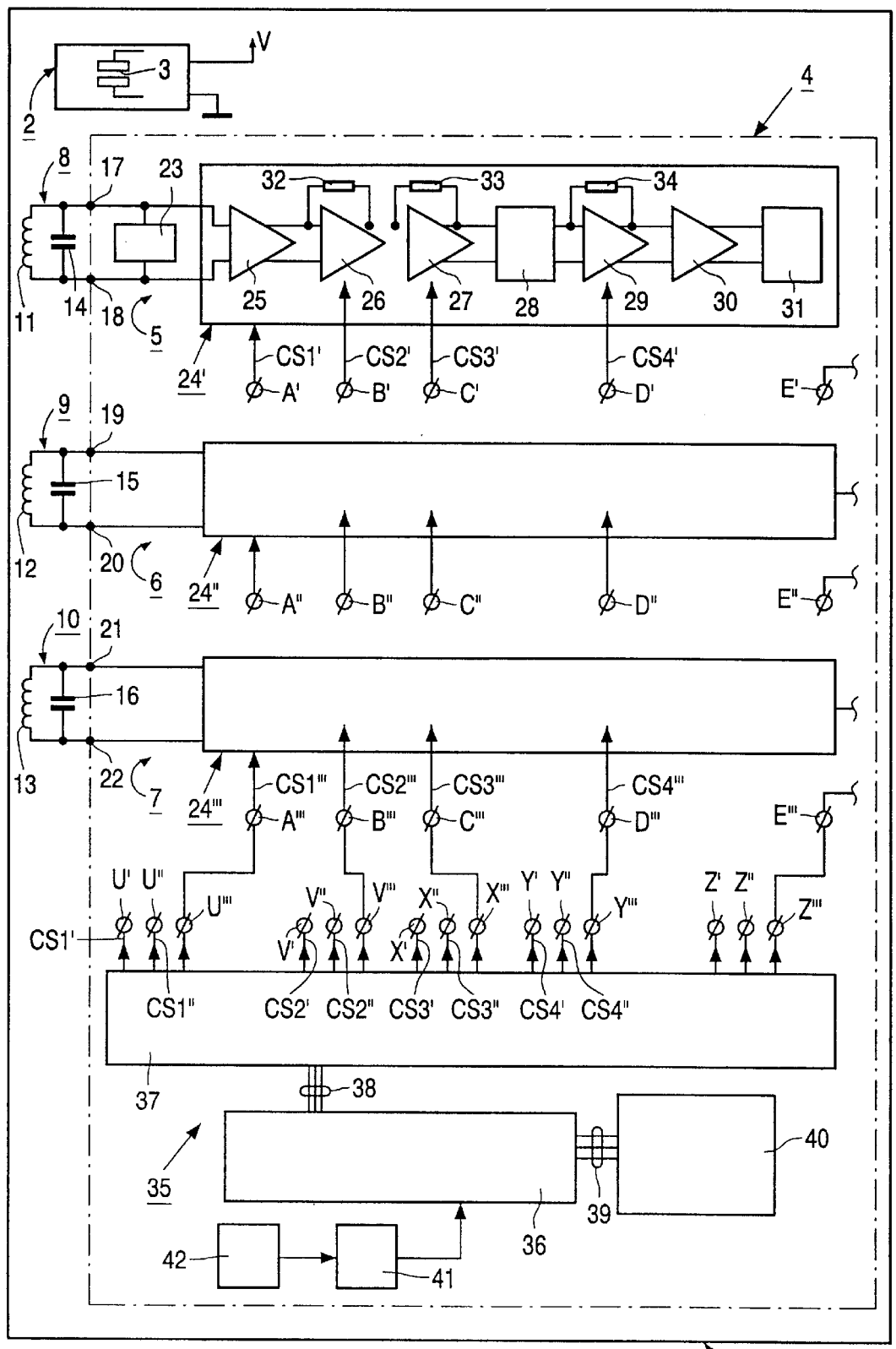
FIG. 1 shows those parts of a transponder according to the invention which are essential in the present context in the form of a block diagram.

FIG. 1 shows a transponder 1. The transponder 1 is a combined transponder comprising an active transponder and a passive transponder. Only the active part, i.e. the active transponder, of the combined transponder 1 is illustrated in FIG. 1.

The transponder 1 comprises power supply means 2 which comprise a non-rechargeable battery 3. A supply voltage V, which can be supplied to all those circuit parts of the active transponder 1 which are to be supplied with this supply voltage V, can be generated by means of the battery 3 and voltage stabilizing means not illustrated in detail.

The transponder 1 also comprises an integrated circuit 4.

The transponder 1 has three signal channels 5, 6 and 7. Only the circuit details of the first signal channel 5 are represented schematically here. The two further signal channels 6 and 7 have the same circuit structure as the first signal channel 5.

Each of the three signal channels 5, 6, 7 has transmission means 8, 9, 10. Each of the transmission means 8, 9, 10 comprises a transmission coil 11, 12, 13 and a capacitor 14, 15, 16 connected in parallel to the respective transmission coil 11, 12, 13. Each of the transmission means 8, 9, 10 is connected to two terminals 17, 18, and 19, 20, and 21, 22, respectively, of the integrated circuit 4.

The further structure of the three signal channels 5, 6, 7 is described only with reference to the first signal channel 5.

A limiter stage 23, frequently referred to as a limiter, is connected to the two terminals 17 and 18. A signal processing circuit 24' is connected to the output side of the limiter stage 23.

Similar signal processing circuits 24", 24'" are provided for the second signal channel 6 and the third signal channel 7, respectively.

The signal processing circuit 24' comprises seven serially connected signal processing stages. These seven signal processing stages are a first amplifier stage 25, a second amplifier stage 26, a third amplifier stage 27, a demodulator stage 28, a fourth amplifier stage 29, and a fifth amplifier stage 30 together with a decoder stage 31. The five amplifier stages 25, 26, 27, 29, and 30 each serve to amplify the signals supplied to them. The demodulation stage 28 serves to demodulate the signals received by means of the first transmission means 8 and subsequently amplified. The decoder stage 31 serves to decode the signals emitted from the demodulator stage 28 and subsequently amplified.

Of the seven signal processing stages the second, third, and fifth signal processing stages, i.e. the three amplifier stages 26, 27, and 29, are configured to be activatable and deactivatable, as will be explained in more detail below. A bypass branch 32, 33, 34 associated with the respective amplifier stage 26, 27, 29 is provided for each activatable and deactivatable signal processing stage, i.e. for each of the three amplifier stages 26, 27, and 29. Each of these bypass branches 32, 33, and 34, like the associated amplifier stages 26, 27, 29, is configured so as to be activatable and deactivatable, as will be explained in more detail below.

To activate and to deactivate the three amplifier stages 26, 27 and 29 and to activate and to deactivate the associated bypass branches 32, 33, and 34, a control signal CS2', CS3', CS4' can be supplied to these circuit parts via a respective circuit point B', C', D', as will be explained in more detail below.

In the present case, the entire signal processing circuit 24' is additionally configured so as to be activatable and deactivatable. To activate and deactivate the entire signal processing circuit 24', a control signal CS1 ' can be supplied to the signal processing circuit 24' from a circuit point A'.

It should also be noted that the first amplifier stage 25 and the fifth amplifier stage 30 as well as the demodulator stage 28 and the decoder stage 31 are not configured so as to be separately activatable and deactivatable. Activation and deactivation of these stages is only possible by activating or deactivating the entire respective signal processing circuit 24', 24", 24"' by means of the respective control signal CS1', CS1", CS1"'.

The transponder 1 and therefore the integrated circuit 4 further contain control means 35 which are provided and configured for activating and deactivating the activatable and deactivatable signal processing stages 26, 27, and 29, for activating and deactivating the activatable and deactivatable bypass branches 32, 33, and 34, and for activating and deactivating the entire signal processing circuits 24', 24", and 24"'. These control means 35 include a microcomputer 36 and a control register 37 controllable by the microcomputer 36, which are connected together via a control connection 38. The microcomputer 36 is connected via a further connection 39 to storage means 40, the storage means 40 being composed of a plurality of storage units, namely a RAM, a ROM, and an EEPROM. The activatable and deactivatable signal processing stages, i.e. the amplifier stages 26, 27, and 29 and the activatable and deactivatable bypass branches 32, 33, and 34 are controllable for activation and deactivation thereof by means of the control register 37. For this purpose, the control register 37 has a plurality of control outputs denoted in FIG. 1 by the following reference characters: U', U", U"' and V', V", V"' and X', X", X"' and Y', Y", Y"' and Z', Z", Z"'. These control outputs are connected to the circuit points A', A", A"' and B', B", B"' and C', C", C"' and D', D", D"' and E', E", E"'. The three circuit points E', E" and E"' are connected to further activatable and deactivatable signal processing stages which, however, are not represented in FIG. 1.

The control means 35 also comprise additional timing means 41, which timing means 41 are connected to an oscillator 42 which supplies a signal to the timing means 41, and which timing means 41 are connected to the microcomputer 36 so that it is possible for the timing means 41 to supply time information to the microcomputer 36. The microcomputer 36 is configured to register the expiration of a preset time interval. In addition, the microcomputer 36 is so configured that after registering the expiration of the preset time interval the microcomputer 36 controls the control register 37 such that the control register 37 switches all the signal processing stages 25, 26, 27, 28, 29, 30, and 31 to their deactivated state, which is realized in a simple manner in the transponder 1 and the integrated circuit 4 of FIG. 1 in that the control register 37 switches all three signal processing circuits 24', 24", and 24"' to their deactivated state via its control outputs U', U", and U"'.

It should also be noted that further signal processing means are connected to the signal processing circuits 24', 24", and 24"' of the transponder 1, for example, data processing means and data storage means, which, however, are not represented in FIG. 1 because the provision of such means is judged to be generally known.

The way in which the second amplifier stage 26 and the bypass branch 32 associated with the second amplifier stage 26 can each be controlled so as to be switched to the activated state and to the deactivated state will be described in more detail below with reference to FIG. 2.

The second amplifier stage 26 has a first input 50 and a second input 51 and a first output 52 and a second output 53. A first controllable switch 54 is connected to the first input 50. A second controllable switch 55 is connected to the second input 51. A third controllable switch 56 is connected to the first output 52. A fourth controllable switch 57 is connected to the second output 53. The second amplifier stage 26 also has a first supply voltage input 58 and a second supply voltage input 59. The first supply voltage input 58 can be connected to the supply voltage V via a line 60, a fifth controllable switch 61 being incorporated in the line 60. The second supply voltage input 59 can be connected to ground via a further line 62, a sixth controllable switch 63 being incorporated in the further line 62.

The bypass branch 32 associated with the second amplifier stage 26 is realized in a simple manner by means of two bypass lines 64 and 65, a seventh controllable switch 66 being incorporated in the first bypass line 64 and an eighth controllable switch 67 being incorporated in the second bypass line 65.

Figure 2:
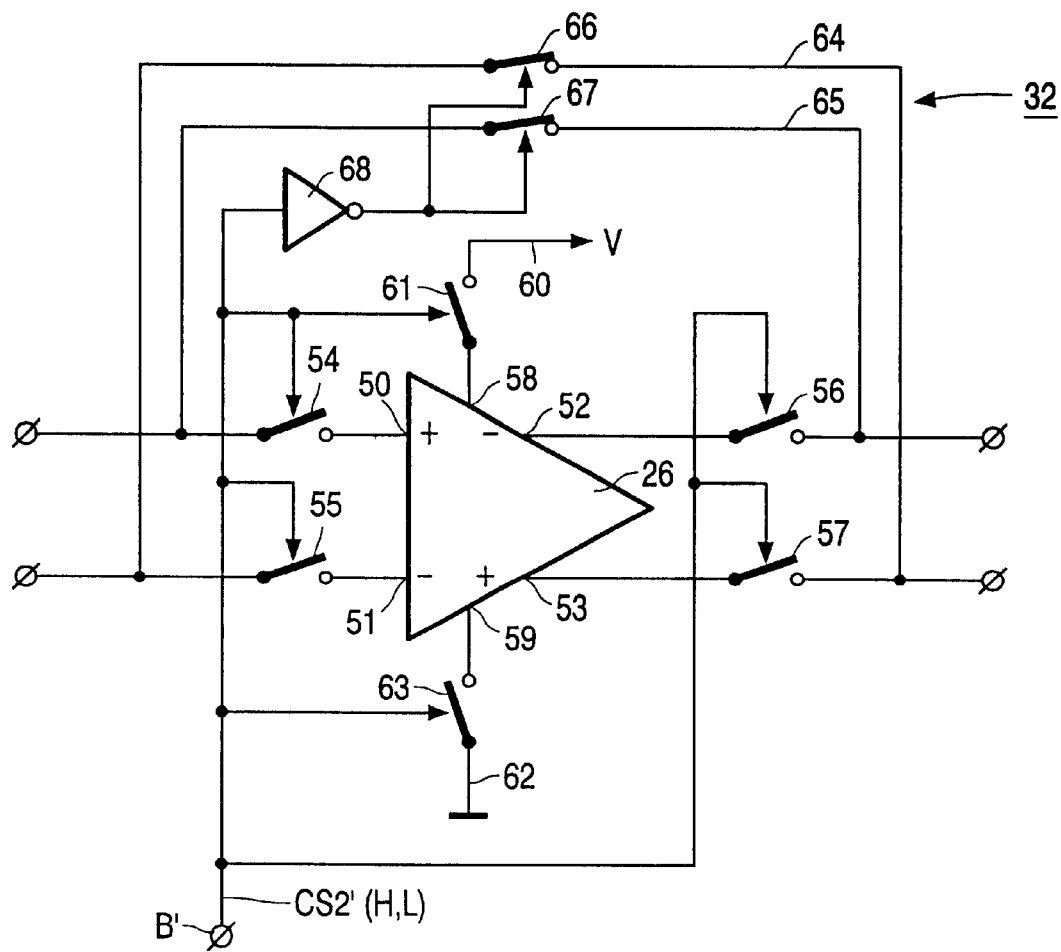
FIG. 2 shows a circuit detail of the transponder of FIG. 1 which is important in the present context.

FIG. 2 shows the situation in which the activatable and deactivatable second amplifier stage 26 has been switched to its deactivated state and in which the bypass branch 32 associated with the second amplifier stage 26 has been switched to its activated state, as is evidenced by the fact that the six switches 54, 55, 56, 57, 61, and 63 are in their non-conducting state and the two switches 66 and 67 are in their conducting state.

All eight switches are controlled by means of the control signal CS2' which can be supplied to circuit point B', specifically from the control output V', by the control register 37 of the control means 35. When this happens the control signal CS2' is supplied directly to the six switches 54, 55, 56, 57, 58 and 59, but is supplied to the two switches 66 and 67 via an inverter stage 68. It is achieved thereby that upon the occurrence of the control signal CS2', which is formed by a high potential H, the six switches 54, 55, 56, 57, 61, and 63 are closed and the two further switches 66 and 67 are opened. When the control signal CS2' ceases, i.e. when a low potential L occurs at the circuit point B', the six switches 54, 55, 56, 57, 61, and 63 will be switched to their non-conducting state, and the two further switches 66 and 67 will be switched to their conducting state, as is represented in FIG. 2.

The third amplifier stage 27 and the fourth amplifier stage 29 and the two bypass branches 32 and 34 are controllable in exactly the same manner. The signal processing circuits 24', 24", and 24"' are controlled in an analogous manner.

As can be clearly seen from the preceding description, the control means 35 and the activatable and deactivatable signal processing stages 26, 27, 29 and the activatable and deactivatable bypass branches 32, 33, 34 are so configured in the transponder 1 and the integrated circuit 4 that, when one of these signal processing stages 26, 27, 29 is deactivated, the bypass branch 32, 33, 34 associated with this signal processing stage 26, 27, 29 is activated at the same time, and that, when one of these signal processing stages 26, 27, 29 is activated, the bypass branch 32, 33, 34 associated with this signal processing stage 26, 27, 29 is deactivated at the same time.

In the transponder 1 according to FIG. 1, an optional configuration facility is provided by the control means 35, yielding the advantage that the transponder 1 can be optimally configured for the operating condition existing at any time, it being possible in each case to achieve the optimum, i.e. lowest possible energy consumption through the optional configuration facility. The optional activation and deactivation of the activatable and deactivatable amplifier stages makes it possible to achieve the best possible compromise between the highest possible reception sensitivity and the lowest possible energy consumption in the transponder 1.

In the above-described transponder 1 according to FIG. 1, all the signal processing stages of one signal channel are connected in series. This is not absolutely necessary, since realizations are possible with transponders according to the invention in which signal processing stages are connected in parallel, at least one of which can be configured so as to be capable of activation and deactivation.

It should also benoted with regard to the active transponder of the transponder 1 of FIG. 1 that it is not always necessary for all three signal channels 5, 6, and 7 to be in use in the active transponder, but that there are also operating conditions in which, for example, it is possible to make do with only one signal channel, the two other signal channels being deactivated by deactivation of the relevant signal processing circuit 24', 24'', 24'''. In this case, too, a marked reduction in energy consumed, and therefore a longer service life of the non-rechargeable battery 3, is ensured.

In the transponder 1 described with reference to FIG. 1, in which only the active transponder is illustrated, only the non-rechargeable battery 3 is shown as the power source. It is to be noted that the transponder 1 additionally comprises a passive transponder in which power is obtained from a signal transmitted to the passive transponder, which signal is rectified by rectifier means, whereupon the supply voltage obtained by rectification is stored in a storage capacitor which essentially forms the power supply means for the passive transponder.

What is claimed is:

1. A transponder (1) having at least one signal channel (5, 6, 7), which signal channel (5, 6, 7) having transmission means (8, 9, 10) and at least two signal processing stages (25, 26, 27, 28, 29, 30, 31) connected to the output side of said transmission means (8, 9, 10), wherein at least one signal processing stage (26, 27, 29) is configured such that it is activatable and deactivatable, and wherein for each activatable and deactivatable signal processing stage (26, 27, 29) an associated bypass branch (32, 33, 34) being provided for bypassing the associated signal processing stage (26, 27, 29), which bypass branch (32, 33, 34) is also configured so as to be activatable and deactivatable, and wherein control means (35) are provided by which the at least one activatable and deactivatable signal processing stage (26, 27, 29) and the at least one associated activatable and deactivatable bypass branch (32, 33, 34) are activatable and deactivatable, and wherein the control means (35) and the at least one activatable and deactivatable signal processing stage (26, 27, 29) and the at least one associated activatable and deactivatable bypass branch (32, 33, 34) are so configured such that when one activatable and deactivatable signal processing stage (26, 27, 29) is deactivated the bypass branch (32, 33, 34) associated with this signal processing stage (26, 27, 29) is activated at the same time, and that when one signal processing stage (26, 27, 29) is activated the bypass branch (32, 33, 34) associated with this signal processing stage (26, 27, 29) is deactivated at the same time.

2. A transponder (1) as claimed in claim 1, wherein at least some of the activatable and deactivatable signal processing stages (26, 27, 29) are formed by amplifier stages.

3. A transponder (1) as claimed in claim 1, wherein the control means (35) comprise a microcomputer (36) and a control register (37) controllable by the microcomputer (36), by means of which control register (37) the activatable and deactivatable signal processing stages (26, 27, 29) and the activatable and deactivatable bypass branches (32, 33, 34) are controllable into their activated and deactivated states.

4. A transponder (1) as claimed in claim 3, wherein the control means (35) additionally have timing means (41) connected to the microcomputer (36), and in that the microcomputer (36) is configured so as to register the expiration of a preset time interval, and in that the microcomputer (36), after registering the expiration of said preset time interval, controls the control register (37) such that said control register (37) controls all the signal processing stages (25, 26, 27, 28, 29, 30, 31) so as to switch them to their deactivated state.

5. An integrated circuit (4) for a transponder (1), which integrated circuit (4) having at least one signal channel (5, 6, 7), which signal channel (5, 6, 7) having transmission means (8, 9, 10) and at least two signal processing stages (25, 26, 27, 28, 29, 30, 31) connected to the output side of the transmission means (8, 9, 10), wherein at least one signal processing stage (26, 27, 29) is configured such that it is activatable and deactivatable, and wherein for each activatable and deactivatable signal processing stage (26, 27, 29) an associated bypass branch (32, 33, 34) being provided for bypassing the associated signal processing stage (26, 27, 29), which bypass branch (32, 33, 34) is also configured so as to be activatable and deactivatable, and wherein control means (35) are provided by which the at least one activatable and deactivatable signal processing stage (26, 27, 29) and the at least one associated activatable and deactivatable bypass branch (32, 33, 34) are activatable and deactivatable, and wherein the control means (35) and the at least one activatable and deactivatable signal processing stage (26, 27, 29) and the at least one associated activatable and deactivatable bypass branch (32, 33, 34) are configured such that when one activatable and deactivatable signal processing stage (26, 27, 29) is deactivated the bypass branch (32, 33, 34) associated with this signal processing stage (26, 27, 29) is activated at the same time, and that when one signal processing stage (26, 27, 29) is activated the bypass branch (32, 33, 34) associated with this signal processing stage (26, 27, 29) is deactivated at the same time.

6. An integrated circuit (4) as claimed claim 5, wherein at least some of the activatable and deactivatable signal processing stages (26, 27, 29) are formed by amplifier stages.

7. An integrated circuit (4) as claimed in claim 5, wherein the control means (35) comprise a microcomputer (36) and a control register (37) controllable by the microcomputer (36), by means of which control register (37) the activatable and deactivatable signal processing stages (26, 27, 29) and the activatable and deactivatable bypass branches (32, 33, 34) are controllable into their activated and deactivated states.

8. An integrated circuit (4) as claimed in claim 7, wherein the control means (35) additionally have timing means (41) connected to the microcomputer (36), and in that the microcomputer (36) is configured so as to register the expiration of a preset time interval, and in that the microcomputer (36), after registering the expiration of said preset time interval, controls the control register (37) such that said control register (37) controls all the signal processing stages (25, 26, 27, 28, 29, 30, 31) so as to switch them to their deactivated state.

* * * * *